United States Patent
Nguyen et al.

(10) Patent No.: US 10,159,163 B2
(45) Date of Patent: Dec. 18, 2018

(54) INDICATE A FUNCTIONAL STATUS OF CORRESPONDING ELECTRONIC DEVICES

(71) Applicant: HEWLETT PACKARD ENTERPRISE DEVELOPMENT LP, Houston, TX (US)

(72) Inventors: Minh H Nguyen, Katy, TX (US); Paul E Westphall, Tomball, TX (US); Martha Gomez, Sr., Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/509,391

(22) PCT Filed: Sep. 10, 2014

(86) PCT No.: PCT/US2014/055005
§ 371 (c)(1),
(2) Date: Mar. 7, 2017

(87) PCT Pub. No.: WO2016/039742
PCT Pub. Date: Mar. 17, 2016

(65) Prior Publication Data
US 2017/0280583 A1    Sep. 28, 2017

(51) Int. Cl.
*H05K 7/14* (2006.01)
*G06F 1/18* (2006.01)
*H01R 12/71* (2011.01)

(52) U.S. Cl.
CPC ......... *H05K 7/1494* (2013.01); *G06F 1/185* (2013.01); *H01R 12/71* (2013.01); *H05K 7/1487* (2013.01)

(58) Field of Classification Search
CPC .... G06F 1/185; H05K 7/1494; H05K 7/1487; H01R 12/71
See application file for complete search history.

(56) References Cited

U.S. PATENT DOCUMENTS

| | | |
|---|---|---|
| 5,673,028 A | 9/1997 | Levy |
| 6,088,746 A * | 7/2000 | Koppa ............... G06F 13/385 348/222.1 |
| 6,694,831 B2 | 2/2004 | Assimos et al. |
| 7,259,665 B2 | 8/2007 | Jones et al. |
| 7,321,312 B1 | 1/2008 | Garnett |
| 7,652,872 B1 | 1/2010 | Mease |
| 7,673,176 B2 | 3/2010 | Bradshaw et al. |
| 7,805,618 B2 | 9/2010 | Covi |
| 8,650,414 B2 | 2/2014 | Jayakumer |

(Continued)

OTHER PUBLICATIONS

"Troubleshooting Strategies," Sun Fire V890 Server Diagnostics Guide, 817-5950-11, 2004, http://docs.oracle.com/cd/E19095-01/sfv890.srvr/817-5950-11/890-troubleshooting.html.

(Continued)

*Primary Examiner* — Nimesh G Patel
(74) *Attorney, Agent, or Firm* — Hewlett Packard Enterprise Patent Department

(57) ABSTRACT

A removable electronic module usable with an electrical system includes a main body, electronic devices, indicators, and a switching member. The indicators receive the power by the power storage device when the main body is removed from a slot and electrically disconnected from the electrical system to indicate a functional status of the corresponding electronic devices when placed in an active state.

15 Claims, 6 Drawing Sheets

(56) References Cited

U.S. PATENT DOCUMENTS

| | | | |
|---|---|---|---|
| 2006/0094466 A1* | 5/2006 | Tran | H04B 1/3877 |
| | | | 455/558 |
| 2006/0288158 A1* | 12/2006 | Liao | G06F 3/0635 |
| | | | 711/113 |
| 2008/0046650 A1 | 2/2008 | Rippens | |
| 2009/0051621 A1* | 2/2009 | Liang | H01Q 1/2275 |
| | | | 343/906 |
| 2011/0018490 A1* | 1/2011 | Furuya | G06K 19/0701 |
| | | | 320/101 |
| 2013/0007356 A1 | 1/2013 | Liu | |

OTHER PUBLICATIONS

J. E. Hughes "BladeCenter processor blades, I/O expansion adapters, and units." IBM Journal of Research and Development. Nov. 2005, vol. 49, No. 3, pp. 837-859.

PCT/ISA/KR, International Search Report dated Jun. 10, 2015, PCT/US2014/055005, 11 pps.

\* cited by examiner

INDICATE A FUNCTIONAL STATUS OF CORRESPONDING ELECTRONIC DEVICES

BACKGROUND

Removable electronic modules such as memory cartridges are removably inserted into slot s of a chassis of an electrical system. The electronic modules include electronic devices such as dual inline memory modules powered by and in communication with the electrical system when inserted into the slots of the chassis.

BRIEF DESCRIPTION OF THE DRAWINGS

Non-limiting examples are described in the following description, read with reference to the figures attached hereto and do not limit the scope of the claims. Dimensions of components and features illustrated in the figures are chosen primarily for convenience and clarity of presentation and are not necessarily to scale. Referring to the attached figures:

DETAILED DESCRIPTION

Removable electronic modules such as memory cartridges are removably inserted into slots of a chassis such as a server system. The removable electronic modules include electronic devices such as dual inline memory modules powered by and in communication with the server system when inserted into the slots of the chassis. Periodically, a respective electronic device may malfunction. The entire server system may have to be shut down in order to diagnose the malfunction and identify the faulty electronic device. Shutting down the server system reduces the performance and effectiveness thereof In examples, a removable electronic module is usable with an electrical system. The removable electronic module includes a main body, electronic devices, a power storage device, indicators, and a switching member. The main body to be inserted into and removed from a slot of a chassis of an electrical system. The power storage device receives and stores power when the main body is inserted into the slot to electrically connect to the electrical system. The switching member includes an ON state and an OFF state. The switching member places the indicators in the active state when the switching member is placed in the ON state. The indicators correspond to the electronic devices, respectively. The indicators receive the power by the power storage device when the main body is removed from slot and electrically disconnected from the electrical system to indicate a functional status of the corresponding electronic devices when placed in the active state. Thus, the respective malfunctioning electronic device may be identified without shutting down the entire server system. For example, a respective electronic module may be removed and provide a functional status of its respective electronic devices.

Figure 1:
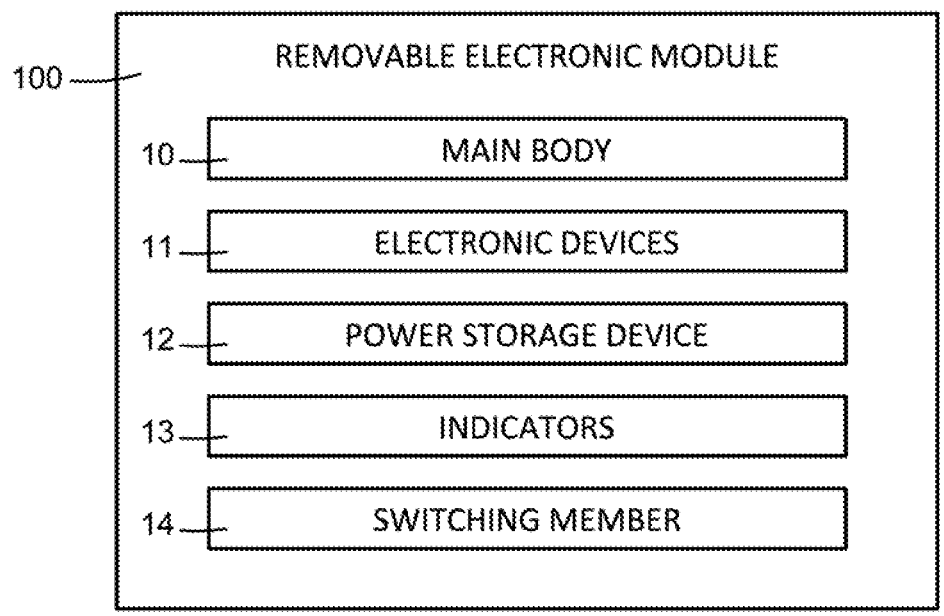
FIG. 1 is a block diagram illustrating a removable electronic module according to an example.

FIG. 1 is a block diagram illustrating a removable electronic module according to an example. The removable electronic module 100 is usable with an electrical system. In some examples, the electrical system may include a server system, and the like. Referring to FIG. 1, the removable electronic module 100 includes a main body 10, a plurality of electronic devices 11, a power storage device 12, a plurality of indicators 13, and a switching member 14. The main body 10 is inserted into and removed from a slot of a chassis of the electrical system to electrically connect to and disconnect from the electrical system. The electronic devices 11 and the power storage device 12 are disposed on the main body 10. The electronic devices 11 receive power when the main body 10 is inserted into the slot to electrically connect to the electrical system. That is, the electronic devices 11 are powered by the electrical system when the main body is installed in the slot and not powered by the electrical system when the main body 10 is removed from the slot.

Referring to FIG. 1, the power storage device 12 stores the power received when the main body 10 is removed from the slot. The indicators 13 are disposed on the main body 10 and correspond to the plurality of electronic devices 11 respectively. That is, each indicator 13 communicates with a respective electronic device 11. The indicators 13 receive the power by the power storage device 12 when the main body 10 is removed from slot and electrically disconnected from the electrical system. When the main body 10 is removed from the slot, and the indicators 13 are placed in an active state, the indicators 13 indicate a functional status of the corresponding electronic devices 11. A switching member 14 includes an ON state and an OFF state. The switching member 14 places the indicators 13 in the active state when the switching member 14 is placed in the ON state. Alternatively, the switching member 14 places the indicators 13 in the inactive state when the switching member 14 is placed in the OFF state. Thus, for example, a user may remove a removable electronic module 100 from a slot of the chassis and activate the indicators 13 to obtain the functional status of the respective electronic devices 11 by placing the switching member 14 in the ON state.

Figure 2:
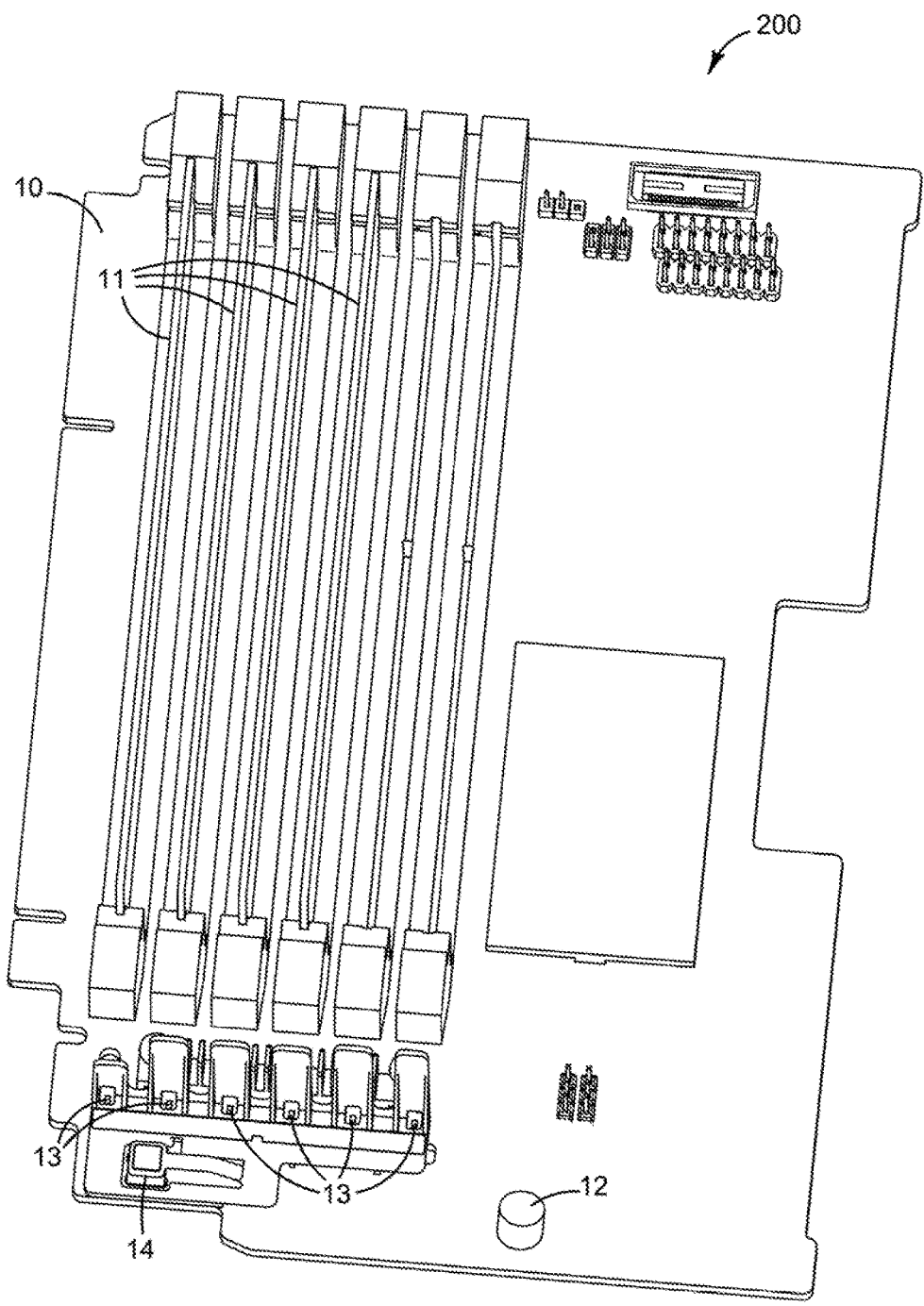
FIG. 2 is a perspective view illustrating a removable electronic module according to an example.

FIG. 2 is a perspective view illustrating a removable electronic module according to an example. The removable electronic module 200 is usable with an electrical system. Referring to FIG. 2, in some examples, the removable electronic module 100 includes a main body 10, a plurality of electronic devices 11, a power storage device 12, a plurality of indicators 13, and a switching member 14. The main body 10 is inserted into and removed from a slot of a chassis of the electrical system to electrically connect to and disconnect from the electrical system. In some examples, the main body 10 may be a printed circuit board.

Referring to FIG. 2, in some examples, the electronic devices 11 and the power storage device 12 are disposed on the main body 10. Each one of the electronic devices 11 may include at least one of an electronic circuit or an electronic component. In some examples, the electronic devices 11 may be removable printed circuit boards such as DIMM boards. The electronic devices 11 receive power when the main body 10 is inserted into the slot to electrically connect to the electrical system. That is, the electronic devices 11 are powered by the electrical system when the main body 10 is inserted in the slot. Alternatively, the electronic devices 11 are not powered by the electrical system when the main body 10 is removed from the slot.

Referring to FIG. 2, in some examples, the power storage device 12 stores the power received when the main body 10 is removed from the slot. That is, the electrical system may provide energy such as current or voltage to the power storage device 12 when in electrical communication therewith. Additionally, the energy received by the power storage device 12 may be stored therein even when the power storage device 12 is not in electrical communication with the electrical system. In some examples, the power storage device 12 includes at least one capacitor. The indicators 13 are disposed on the main body 10 and correspond to the plurality of electronic devices 11 respectively. That is, each indicator 13 communicates with a respective electronic device 11. The indicators 13 receive the power stored by the power storage device 12 when the main body 10 is removed from slot and electrically disconnected from the electrical system. When the main body 10 is removed from the slot, and the indicators are placed in an active state, the indicators 13 indicate a functional status of the corresponding electronic devices 11.

Referring to FIG. 2, in some examples, the functional status may correspond to a non-functional state and a functional state of the respective electronic devices 11. The indicators 13 may function independently from the electrical system and be powered by the power storage device 12 to indicate the functional status of each of the electronic devices 11. In some examples, the indicators 13 include lights such as light emitting diodes (LEDS). For example, a lighting of an LED may correspond to the functional state of the corresponding electronic device 11. That is, a respective indicator 13 may determine and indicate whether its corresponding electronic device 11 is operable or malfunctioning. In some examples, a steady light or flashing light sequence of the LED may correspond to a respective state of the corresponding electronic device 11. A switching member 14 includes an ON state and an OFF state. For example, the switching member 14 may include a push button switch to be toggled between the ON state and the OFF state. The switching member 14 places the indicators 13 in the active state when the switching member 14 is placed in the ON state.

Figure 3:
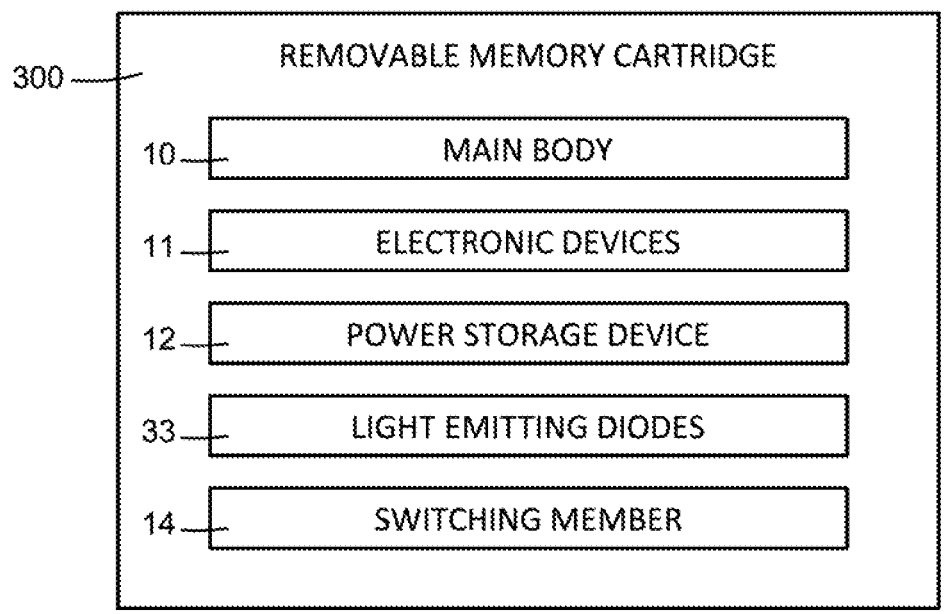
FIG. 3 is a block diagram illustrating a removable memory cartridge according to an example.
Figure 4:
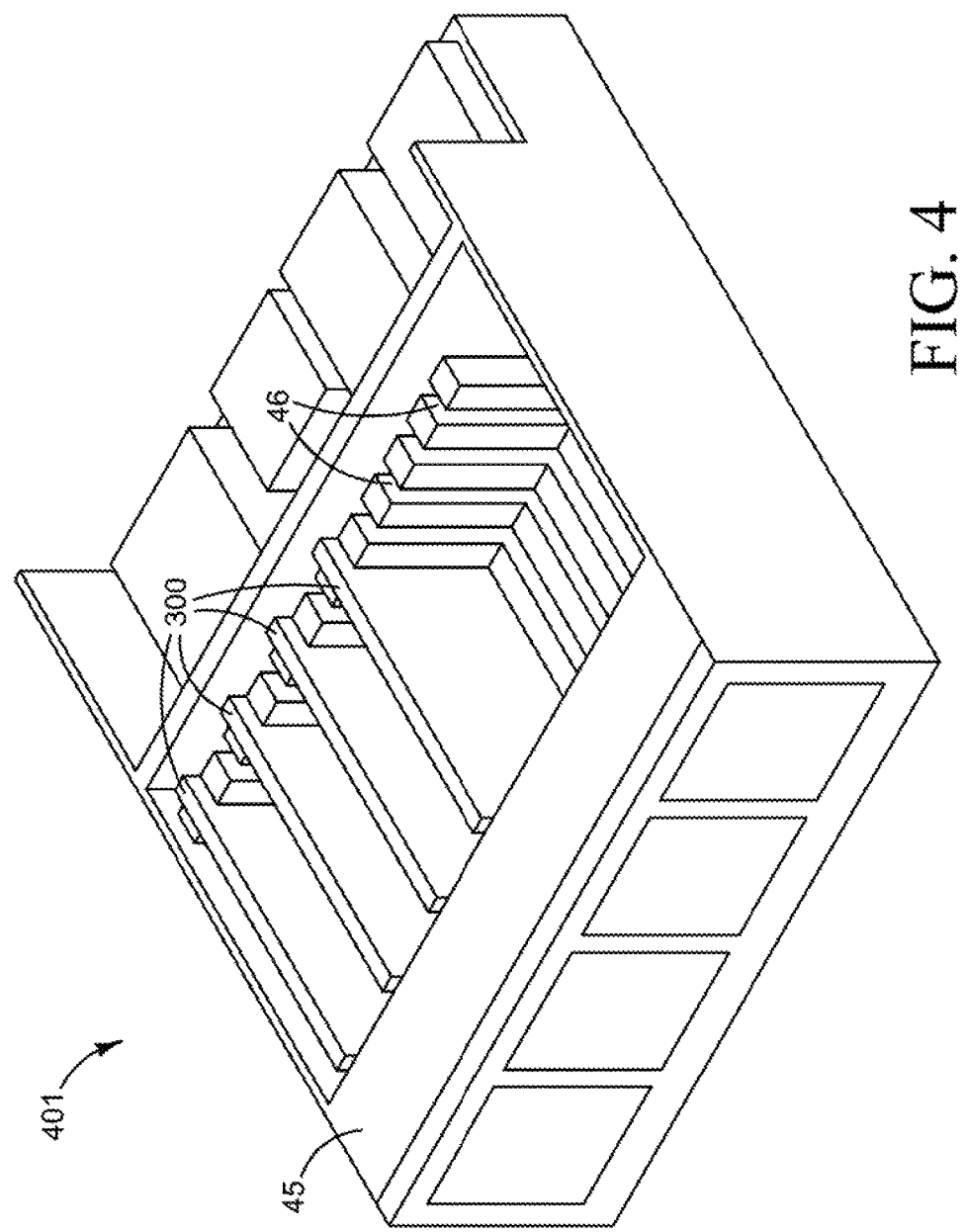
FIG. 4 is a perspective view illustrating a server system with a plurality of removable memory cartridges inserted therein according to an example.
Figure 5:
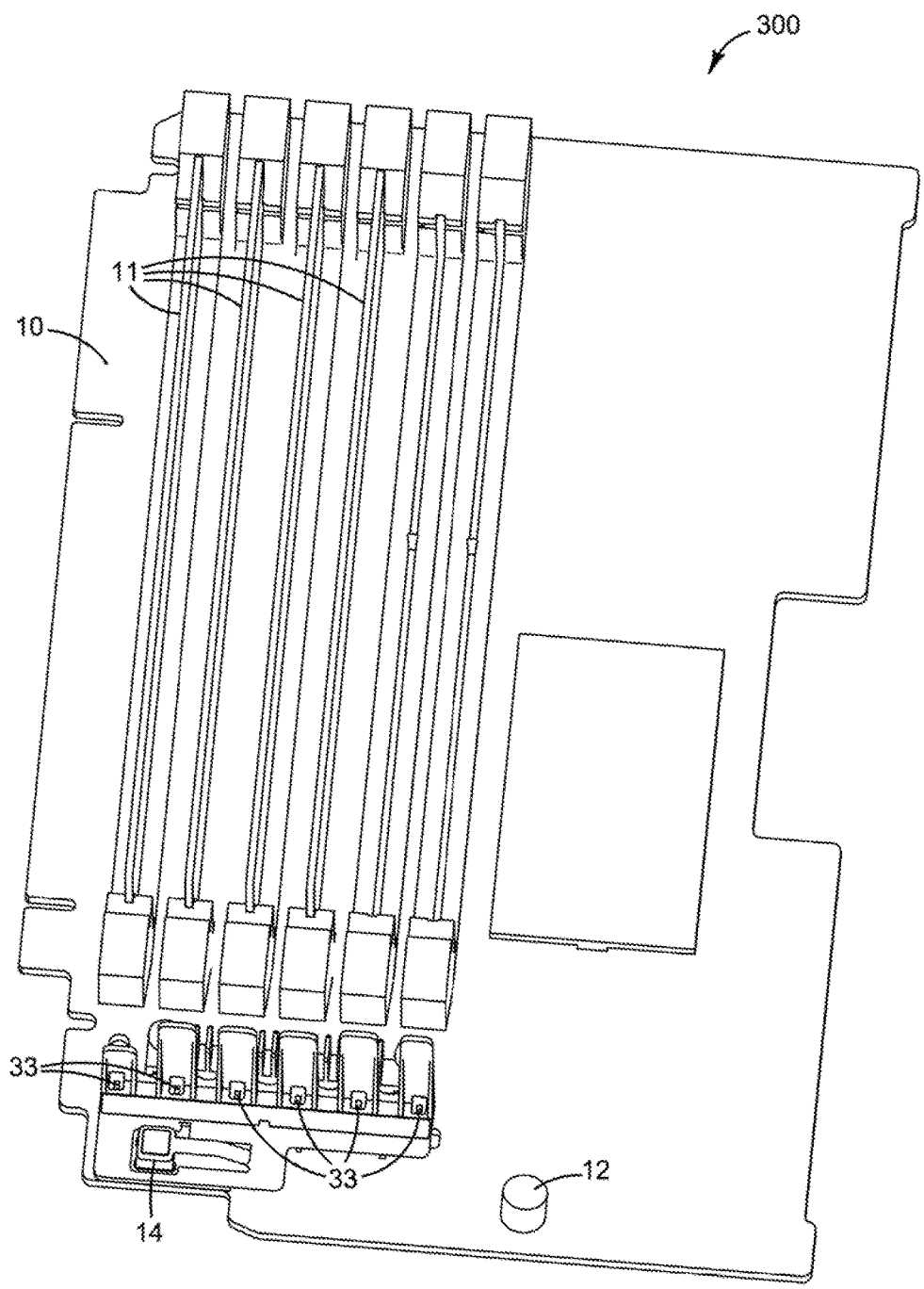
FIG. 5 is a perspective view illustrating a respective removable memory cartridge of FIG. 4 according to an example.

FIG. 3 is a block diagram illustrating a removable memory cartridge according to an example. FIG. 4 is a perspective view illustrating a server system with a plurality of removable memory cartridges inserted therein according to an example. FIG. 5 is a perspective view illustrating a respective removable memory cartridge of FIG. 4 according to an example. The removable memory cartridge 300 is usable with a server system 401. Referring to FIGS. 3-5, in some examples, the server system 401 may include a chassis 45 and a plurality of slots 46. The slots 46 may receive removable memory cartridges 300.

Referring to FIGS. 3-5, in some examples, a removable memory cartridge 300 includes a main body 10, a plurality of electronic devices 11, a power storage device 12, a plurality of light emitting diodes 33, and a switching member 14. The main body 10 is inserted into a respective slot 46 of a chassis 45 of the server system 401 for support and to electrically connect the electronic devices 11 thereto. Additionally, the main body 10 is removed from the slot to electrically disconnect the electronic devices 11 from the server system 401. In some examples, the main body 10 is a printed circuit board. The electronic devices 11 and a power storage device 12 are disposed on the main body 10 to receive power when the main body 10 is inserted into the respective slot 46. That is, the server system 401 may provide energy such as current or voltage to the power storage device 12 when in electrical communication therewith. In some examples, the power storage device 12 includes at least one capacitor.

Referring to FIGS. 3-5, in some examples, the power storage device 12 stores the power previously received by the electrical system. Thus, when the main body 10 is removed from the slot 46 the power storage device 12 may function as a power source for the LEDS. The switching member 14 places the light emitting diodes 33 in the active state in response to the switching member 14 being placed in the ON state. Alternatively, the switching member 14 places the light emitting diodes 33 in the inactive state in response to the switching member 14 being placed in the OFF state. The plurality of light emitting diodes 33 are disposed on the main body 10 and correspond to the plurality of electronic devices 11 respectively. That is, an LED may be in electrical communication with a respective LED to determine and indicate a functional status of a respective electronic device 11. When placed in an active state, the light emitting diodes 33 receive the power from the power storage device 12 when the main body 10 is removed from the slot 46 to indicate a functional status of the corresponding electronic devices 11. The functional status corresponds to a non-functional state and a functional state of the respective electronic devices 11. The switching member 14 includes an ON state and an OFF state.

Figure 6:
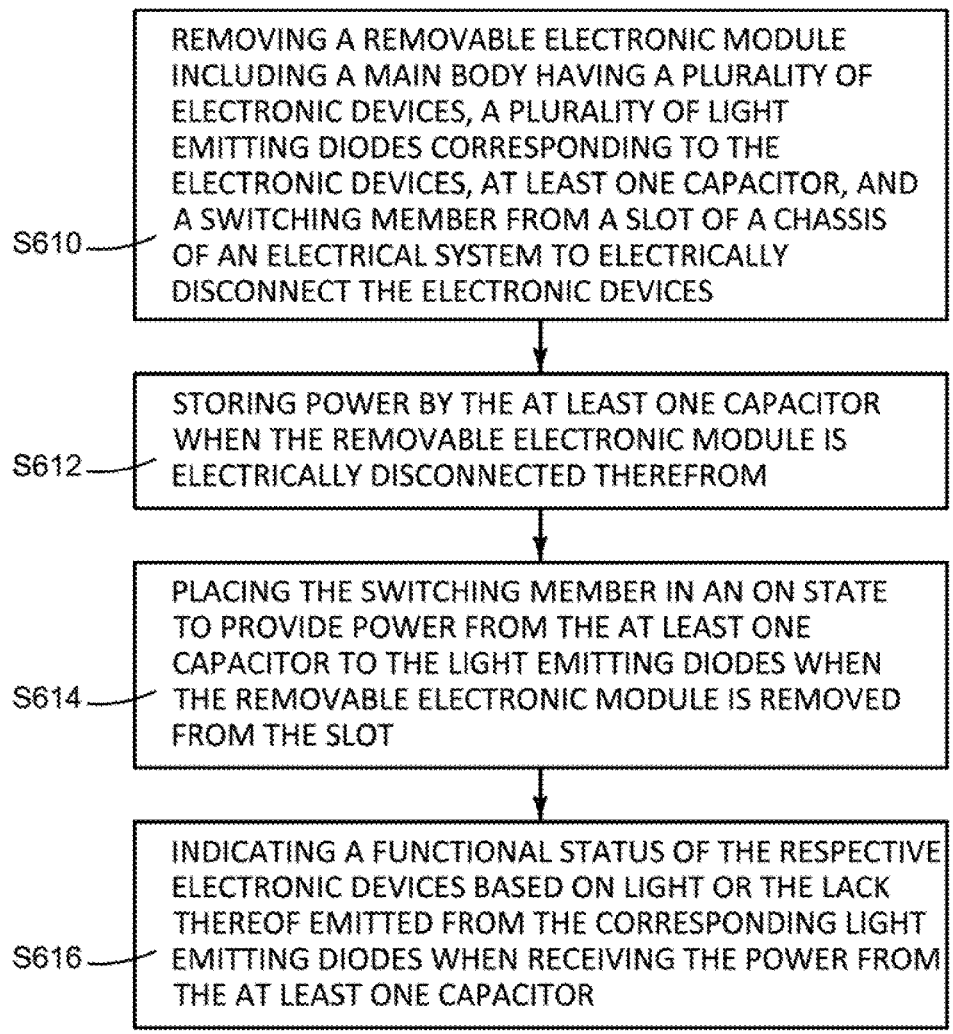
FIG. 6 is a flowchart illustrating a method of checking a functional status of electronic devices of a removable electronic module according to an example.

FIG. 6 is a flowchart illustrating a method of checking a functional status of electronic devices of a removable electronic module according to an example. In some examples, the modules, assemblies, and the like, previously discussed with respect to FIGS. 1-5 may be used to implement the method of FIG. 6. Referring to FIG. 6, in block S610, the electronic module including a main body having a plurality of electronic devices, a plurality of light emitting diodes corresponding to the electronic devices, at least one capacitor, and a switching member is removed from a slot of a chassis of an electrical system to electrically disconnect the electronic devices. In some examples, the main body is a printed circuit board. In some examples, the electronic devices include at least one of an electronic circuit or an electronic component. For example, a respective electronic device may be a printed circuit board such as a DIMM board. The electronic module may be a removable memory cartridge.

In block S612, power is stored by the at least one capacitor when the removable electronic module is electrically disconnected from the electrical system. That is, energy received by the at least one capacitor from the electrical system in a form of current or voltage is stored by the at least one capacitor when it is electrically disconnected from the electrical system. In block S614, the switching member is placed in an ON state to provide power from the at least one capacitor to the light emitting diodes when the removable electronic module is removed from the slot. In some examples, the switching member is a push button switch. For example, a user may press the push button switch to identify the functional state of the respective electronic devices when the main body is removed from the slot and electrically disconnected from the electrical system. In block S616, a functional status of the respective electronic devices is indicated based on light or the lack thereof emitted from the corresponding light emitting diodes when receiving the power from the at least one capacitor. In some examples, a steady light or flashing light sequence of the LEDS may correspond to a respective state of the corresponding electronic device. The functional status may correspond to a non-functional state and a functional state of the respective electronic devices.

It is to be understood that the flowchart of FIG. 6 illustrates architecture, functionality, and/or operation of examples of the present disclosure. If embodied in software, each block may represent a module, segment, or portion of code that includes one or more executable instructions to implement the specified logical function(s). If embodied in hardware, each block may represent a circuit or a number of interconnected circuits to implement the specified logical function(s). Although the flowchart of FIG. 6 illustrates a specific order of execution, the order of execution may differ from that which is depicted. For example, the order of execution of two or more blocks may be rearranged relative to the order illustrated. Also, two or more blocks illustrated in succession in FIG. 6 may be executed concurrently or with partial concurrence. All such variations are within the scope of the present disclosure.

The present disclosure has been described using non-limiting detailed descriptions of examples thereof that are not intended to limit the scope of the general inventive concept. It should be understood that features and/or operations described with respect to one example may be used with other examples and that not all examples have all of the features and/or operations illustrated in a particular figure or described with respect to one of the examples. Variations of examples described will occur to persons of the art. Furthermore, the terms "comprise," "include," "have" and their conjugates, shall mean, when used in the disclosure and/or claims, "including but not necessarily limited to."

It is noted that some of the above described examples may include structure, acts or details of structures and acts that may not be essential to the general inventive concept and which are described for illustrative purposes. Structure and acts described herein are replaceable by equivalents, which perform the same function, even if the structure or acts are different, as known in the art. Therefore, the scope of the general inventive concept is limited only by the elements and limitations as used in the claims.

What is claimed is:

1. A removable electronic module usable with an electrical system, the removable electronic module comprising:
   a main body to insert into a slot of a chassis of the electrical system to electrically connect thereto and to remove from the slot to electrically disconnect from the electrical system;
   a plurality of electronic devices and a power storage device disposed on the main body to receive power when the main body is inserted into the slot to electrically connect to the electrical system, the power storage device to store the power received when the main body is removed from the slot;
   a plurality of indicators disposed on the main body that correspond to the plurality of electronic devices respectively, the indicators to receive the power by the power storage device when the main body is removed from slot and electrically disconnected from the electrical system to indicate a functional status of the corresponding electronic devices when placed in an active state; and
   a switching member having an ON state and an OFF state, the switching member to place the indicators in the active state when the switching member is placed in the ON state.

2. The removable electronic module of claim 1, wherein the functional status corresponds to a non-functional state and a functional state of the respective electronic devices.

3. The removable electronic module of claim 1, wherein the main body comprises:
   a printed circuit board.

4. The removable electronic module of claim 1, wherein the plurality of electronic devices comprises:
   at least one of an electronic circuit or an electronic component.

5. The removable electronic module of claim 1, wherein the electronic devices are removable printed circuit boards.

6. The removable electronic module of claim 1, wherein the indicators comprise:
   lights.

7. The removable electronic module of claim 1, wherein the indicators comprise:
   light emitting diodes.

8. The removable electronic module of claim 1, wherein the switching member comprises:
   a push button switch.

9. The removable electronic module of claim 1, wherein the power storage device comprises at least one capacitor.

10. A removable memory cartridge usable with a server system, the removable memory cartridge comprising:
    a main body to insert into a slot of a chassis of the server system for support and to electrically connect thereto, and to remove from the slot to electrically disconnect from the server system;
    a plurality of electronic devices and a power storage device disposed on the main body to receive power when the main body is inserted into the slot, the power storage device to store the power when the main body is removed from the slot;
    a plurality of light emitting diodes disposed on the main body that correspond to the plurality of electronic devices respectively, the light emitting diodes to receive the power from the power storage device when the main body is removed from the slot to indicate a functional status of the corresponding electronic devices when placed in an active state in which the functional status corresponds to a non-functional state and a functional state of the respective electronic devices; and
    a switching member having an ON state and an OFF state, the switching member to place the light emitting diodes in the active state in response to the switching member placed in the ON state.

11. The removable memory cartridge of claim 10, wherein the main body is a printed circuit board, and the electronic devices are a plurality of removable printed circuit boards.

12. The removable memory cartridge of claim 10, wherein the power storage device comprises at least one capacitor.

13. A method of checking a functional status of electronic devices of a removable electronic module, the method comprising:
    removing the removable electronic module including a main body having a plurality of electronic devices, a plurality of light emitting diodes corresponding to the electronic devices, at least one capacitor, and a switching member from a slot of a chassis of an electrical system to electrically disconnect the electronic devices;
    storing power by the at least one capacitor when the removable electronic module is electrically disconnected therefrom;

placing the switching member in an ON state to provide power from the at least one capacitor to the light emitting diodes when the removable electronic module is removed from the slot; and indicating a functional status of the respective electronic devices based on light or the lack thereof emitted from the corresponding light emitting diodes when receiving the power from the at least one capacitor.

14. The method of claim 13, wherein the functional status corresponds to a non-functional state and a functional state of the respective electronic devices.

15. The method of claim 13, wherein the main body includes a printed circuit board and the electronic devices include at least one of an electronic circuit or an electronic component.

* * * * *